(12) United States Patent
Zhaomeng

(10) Patent No.: US 11,075,270 B2
(45) Date of Patent: Jul. 27, 2021

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventor: Zhaomeng, Shanghai (CN)

(73) Assignees: Semiconductor Manufacturing (Shanghai) International Corporation, Shanghai (CN); Semiconductor Manufacturing (Beijing) International Corporation, Beijing (CN)

(*) Notice: Subject to any disclaimer, the term of this patent is extended or adjusted under 35 U.S.C. 154(b) by 160 days.

(21) Appl. No.: 16/601,847

(22) Filed: Oct. 15, 2019

(65) Prior Publication Data

US 2020/0381516 A1    Dec. 3, 2020

(30) Foreign Application Priority Data

May 31, 2019   (CN) .......................... 201910471954.3

(51) Int. Cl.
*H01L 21/265* (2006.01)
*H01L 29/08* (2006.01)
(Continued)

(52) U.S. Cl.
CPC ........ *H01L 29/0847* (2013.01); *H01L 21/266* (2013.01); *H01L 21/26513* (2013.01);
(Continued)

(58) Field of Classification Search
CPC ........... H01L 29/0847; H01L 21/76834; H01L 21/76805; H01L 21/266; H01L 21/26513;
(Continued)

(56) References Cited

U.S. PATENT DOCUMENTS

| 10,347,762 B1* | 7/2019 | Liu | ..................... H01L 29/7848 |
| 2004/0152297 A1* | 8/2004 | Ooto | ................. H01L 21/76897 |
| | | | 438/629 |
| 2018/0047623 A1* | 2/2018 | Xie | ................. H01L 21/823821 |

* cited by examiner

*Primary Examiner* — Khaja Ahmad
*Assistant Examiner* — Pavel G Ivanov
(74) *Attorney, Agent, or Firm* — Brinks Gilson & Lione

(57) ABSTRACT

The present disclosure provides a semiconductor structure and a method for forming the same. The method includes: providing a base, the base including a source-drain doped region and an interlayer dielectric layer over the source-drain doped region; etching the interlayer dielectric layer to form an opening that exposes the source-drain doped region; and forming a first doped region at the top of the source-drain doped region exposed by the opening and a second doped region over the first doped region, a projection of the second doped region on the base covering a projection of the first doped region on the base, the doping ion types of the first doped region, the second doped region and the source-drain doped region being the same, and the ion doping concentration of the first doped region and the second doped region being higher than the ion doping concentration of the source-drain doped region. The first doped region and the second doped region surround a contact hole plug in the source-drain doped region, such that the contact hole plug is not easily in direct contact with the source-drain doped region, contact resistance between the contact hole plug and the source-drain doped region is reduced, and the electrical performance of the semiconductor structure is improved.

14 Claims, 4 Drawing Sheets

(51) Int. Cl.
*H01L 21/768* (2006.01)
*H01L 21/266* (2006.01)
*H01L 29/417* (2006.01)

(52) U.S. Cl.
CPC .. *H01L 21/76805* (2013.01); *H01L 21/76834* (2013.01); *H01L 29/41766* (2013.01); *H01L 29/41791* (2013.01)

(58) Field of Classification Search
CPC ......... H01L 29/41791; H01L 29/41766; H01L 21/76897; H01L 21/76814; H01L 29/6656; H01L 29/78; H01L 29/7851; H01L 29/66795; H01L 21/26586; H01L 29/785; H01L 29/456; H01L 2029/7858
See application file for complete search history.

SEMICONDUCTOR STRUCTURE AND METHOD FOR FORMING THE SAME

RELATED APPLICATIONS

The present application claims priority to Chinese Patent Appln. No. 201910471954.3, filed May 31, 2019, the entire disclosure of which is hereby incorporated by reference.

BACKGROUND

Technical Field

Embodiments and implementations of the present disclosure relate to the field of semiconductor manufacturing, and in particular to a semiconductor structure and a method for forming the same.

Related Art

In semiconductor manufacturing, with the development of very large-scale integrated circuits, a characteristic size of integrated circuits is continuously decreased. In order to adapt to a smaller characteristic size, a channel length of a metal-oxide-semiconductor field-effect transistor (MOSFET) is also reduced. However, with a shortening of the channel length of a device, a distance between a source region and a drain region of the device is also shortened. As a result, the ability of a gate structure to control a channel becomes poor, and the difficulty for gate voltage to pinch off the channel becomes increasingly great, which makes sub-threshold leakage, i.e., the so-called short-channel effects (SCE), more likely to occur.

Therefore, to reduce the influence of short-channel effects, semiconductor technology has gradually begun to transit from planar MOSFETs to three-dimensional transistors with higher effects, such as fin field effect transistors (FinFETs). In FinFETs, a gate structure can control ultra-thin bodies (fins) at least from two sides. Compared with the planar MOSFET, the gate structure has a stronger ability to control the channel and can suppress the short-channel effects very well. Moreover, compared with other devices, FinFETs have better compatibility with the existing integrated circuit manufacturing.

SUMMARY

To address the problem, embodiments and implementations of the present disclosure provide a semiconductor structure and a method for forming the same to optimize the performance of the semiconductor structure.

In one form, the present disclosure provides a method for forming a semiconductor structure, including: providing a base, the base including a substrate, a gate structure over the substrate, a source-drain doped region in the substrate on two sides of the gate structure, and an interlayer dielectric layer over the source-drain doped region; etching the interlayer dielectric layer to form an opening that exposes the source-drain doped region; forming a first doped region at a top of the source-drain doped region exposed by the opening and a second doped region over the first doped region, where a projection of the second doped region on the base covers a projection of the first doped region on the base, doping ion types of the first doped region, the second doped region and the source-drain doped region are the same, and an ion doping concentrations of the first doped region and the second doped region are higher than an ion doping concentration of the source-drain doped region; after forming the second doped region, etching the first doped region and the second doped region at a bottom of the opening to form a groove surrounded by the first doped region and the second doped region; and forming a contact hole plug in the opening and the groove.

In another form, the present disclosure further provides a semiconductor structure, including: a base, the base including a substrate, a gate structure over the substrate, a source-drain doped region in the substrate on two sides of the gate structure, and an interlayer dielectric layer over the source-drain doped region; a contact hole plug in the source-drain doped region, where the source-drain doped region covers part of a sidewall of the contact hole plug; a first doped region in the source-drain doped region and between the bottom of the contact hole plug and the source-drain doped region, a doping ion type of the first doped region is the same as a doping ion type of the source-drain doped region, and an ion doping concentration of the first doped region is higher than an ion doping concentration of the source-drain doped region; and a second doped region in the source-drain doped region and over the first doped region, where a doping ion type of the second doped region is the same as the doping ion type of the source-drain doped region, an ion doping concentration of the second doped region is higher than the ion doping concentration of the source-drain doped region, the second doped region covers part of the sidewall of the source-drain doped region, and a projection of the second doped region on the base covering a projection of the first doped region on the base.

Compared with the prior art, forms of the technical solution of embodiments and implementations of the present disclosure have the following advantages:

In embodiments and implementations of the present disclosure, the second doped region is located over the first doped region, the projection of the second doped region on the base covers the projection of the first doped region on the base, the doping ion types of the first doped region and the second doped region are the same as the doping ion type of the source-drain doped region, the doping concentrations of the first doped region and the second doped region are higher than the doping concentration of the source-drain doped region, and after the first doped region and the second doped region are formed, the first doped region and the second doped region at the bottom of the opening are etched to form the groove surrounded by the first doped region and the second doped region; and the contact hole plug is formed in the opening and the groove. The first doped region is in contact with the bottom and the sidewall of the contact hole plug, the second doped region is in contact with the sidewall of the contact hole plug, and the first doped region and the second doped region surround the contact hole plug in the source-drain doped region, such that the contact hole plug is not easily in direct contact with the source-drain doped region, contact resistance between the contact hole plug and the source-drain doped region is reduced, and the electrical performance of the semiconductor structure is improved.

DETAILED DESCRIPTION

From the related art, it can be seen that current devices have a problem of poor performance. The reason that the performance of the devices is poor will be analyzed in combination with a method for forming a semiconductor structure.

Figure 1:
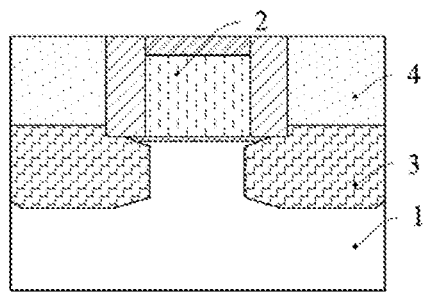
FIG. 1 and FIG. 2 are structural schematic views corresponding to one form of a method for forming a semiconductor structure.
Figure 2:
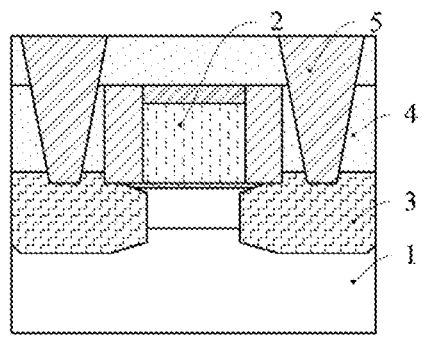

FIG. 1 and FIG. 2 illustrate structural schematic views corresponding to each step in one form of a method for forming a semiconductor structure.

Referring to FIG. 1, a base is provided that includes a substrate 1, a gate structure 2 over the substrate 1, a source-drain doped region 3 in the substrate 1 on two sides of the gate structure 2, and an interlayer dielectric layer 4 over the source-drain doped region 3.

Referring to FIG. 2, the interlayer dielectric layer 4 is etched to form an opening (not shown) that exposes the source-drain doped region 3, and a contact hole plug 5 is formed in the opening.

The contact hole plug 5 is connected with the source-drain doped region 3 to realize the electrical connection of devices in the semiconductor structure and realize the electrical connection between semiconductor structures, but the doping concentration of the source-drain doped region 3 is lower, and the contact resistance between the contact hole plug 5 and the source-drain doped region 3 is relatively large, resulting that the electrical performance of the semiconductor structure is not good.

To address the above technical problem, embodiments and implementations of the present disclosure provide a method for forming a semiconductor structure in which the second doped region is located over the first doped region, the projection of the second doped region on the base covers the projection of the first doped region on the base, the doping ion types of the first doped region and the second doped region are the same as the doping ion type of the source-drain doped region, the doping concentrations of the first doped region and the second doped region are higher than the doping concentration of the source-drain doped region, and after forming the first doped region and the second doped region, the first doped region and the second doped region at the bottom of the opening are etched to form a groove surrounded by the first doped region and the second doped region; and a contact hole plug is formed in the opening and the groove. The first doped region is in contact with the bottom and the sidewall of the contact hole plug, the second doped region is in contact with the sidewall of the contact hole plug, and the first doped region and the second doped region surround the contact hole plug in the source-drain doped region, such that the contact hole plug is not easily in direct contact with the source-drain doped region, the contact resistance between the contact hole plug and the source-drain doped region is reduced and the electrical performance of the semiconductor structure is improved.

In order to make the above purposes, features and advantages of the embodiments of the present disclosure more understandable, specific embodiments and implementations of the present disclosure will be described below in detail with reference to the drawings.

FIG. 3 to FIG. 11 are structural views corresponding to each step in one form of a method for forming a semiconductor structure according to the present disclosure.

Figure 3:
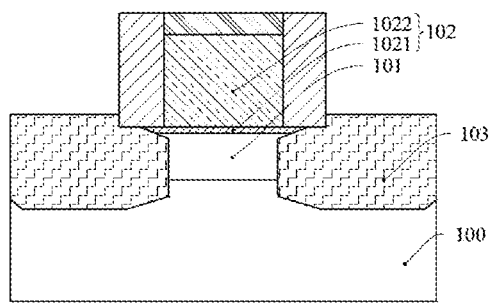
FIG. 3 to FIG. 11 are structural schematic views corresponding to each step in one form of a method for forming a semiconductor structure according to the present disclosure.
Figure 4:
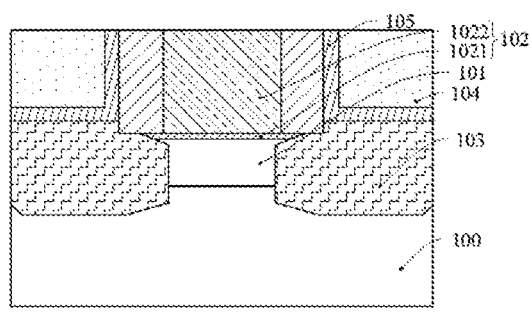
Figure 5:
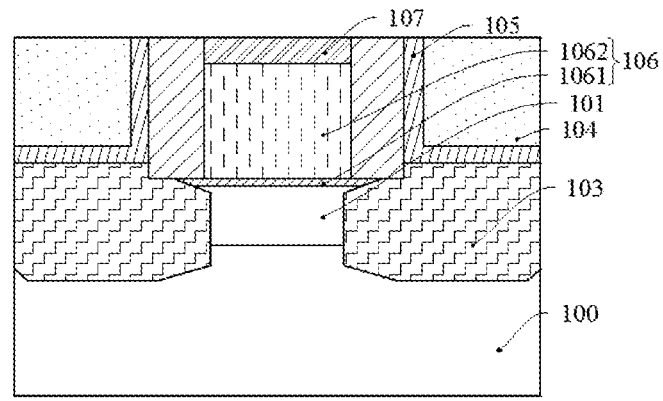

Referring to FIG. 3 to FIG. 5, a base is provided that includes a substrate 100, a gate structure 106 (as illustrated in FIG. 5) over the substrate 100, a source-drain doped region 103 in the substrate 100 on two sides of the gate structure 106, and an interlayer dielectric layer 104 (as illustrated in FIG. 4) over the source-drain doped region 103.

The base provides a process foundation for subsequently forming the semiconductor structure.

Specifically, the step of forming the base includes the following steps:

As illustrated in FIG. 3, a pseudo-gate structure 102 on the substrate 100, and a source-drain doped region 103 in the substrate 100 on two sides of the pseudo-gate structure 102 are formed.

In some implementations, for example, the formed semiconductor structure is a fin field effect transistor (FinFET), and the substrate 100 is a substrate 100 with a fin 101. In other implementations, the formed semiconductor structure may also be a planar structure, and correspondingly, there is no fin on the substrate.

In some implementations, the substrate 100 is a silicon substrate.

The fin 101 is used for subsequently providing the channel of the fin field effect transistor. In some implementations, the fin 101 and the substrate 100 are obtained by etching the same semiconductor layer.

Therefore, in some implementations, the material of the fin 101 is the same as the material of the substrate 100.

The pseudo-gate structure 102 spans the fin 101 and covers part of the top and sidewall of the fin 101. The pseudo-gate structure 102 occupies a space position for the subsequent formation of the gate structure.

In some implementations, the pseudo-gate structure 102 is a polycrystalline silicon pseudo-gate structure. Specifically, the pseudo-gate structure 102 includes a gate oxide layer 1021 and a gate layer 1022 over the gate oxide layer 1021.

The source-drain doped region 103 is located in the fin 101 on two sides of the pseudo-gate structure 102. When the semiconductor structure works, the source-drain doped region 103 provides stress for the channel below the gate structure and improves the carrier mobility.

In some implementations, the semiconductor structure is used for forming a Positive channel Metal Oxide Semiconductor (PMOS) transistor, that is, the material of the source-drain doped region 103 is silicon germanide doped with P-type ions. In some implementations, by doping P-type ions in silicon germanide, the more P-type ions are doped, the higher the concentration of free electrons is, and the stronger the conductivity is. Specifically, P-type ions include B, Ga or In.

In other implementations, the semiconductor structure is used for forming a Negative channel Metal Oxide Semiconductor (NMOS) transistor, that is, the material of the source-drain doped region is correspondingly silicon carbide or silicon phosphide doped with N-type ions. By doping N-type ions in silicon carbide or silicon phosphide, the more N-type ions are doped, the higher the concentration of free electrons is, and the stronger the conductivity is. Specifically, N-type ions include P, As or Sb.

As illustrated in FIG. 4, an interlayer dielectric layer 104 is formed over the source-drain doped region 103. Additionally, the interlayer dielectric layer 104 exposes the top wall of the pseudo-gate structure 102.

The interlayer dielectric layer 104 is used for realizing electrical isolation between adjacent semiconductor structures. Therefore, the material of the interlayer dielectric layer 104 is an insulating material. Specifically, the material of the interlayer dielectric layer 104 is silicon oxide.

The step of forming the interlayer dielectric layer 104 includes: forming an interlayer dielectric material layer covering the pseudo-gate structure 102 and the source-drain doped region 103; and flattening the interlayer dielectric material layer until the pseudo-gate structure 102 is exposed, and using the remaining interlayer dielectric material layer as the interlayer dielectric layer 104.

It should be noted that, after the source-drain doped region 103 is formed, and before the interlayer dielectric layer 104 is formed, an anti-etching layer (contact etch stop layer, CESL) 105 covering a sidewall of the pseudo-gate structure 102 and the source-drain doped region 103 is formed. That is to say, the anti-etching layer 105 is located between the interlayer dielectric layer 104 and the source-drain doped region 103, and between the interlayer dielectric layer 104 and the pseudo-gate structure 102.

In the subsequent process of performing ion doping on the anti-etching layer 105 to form the first doped region in the source-drain doped region 103, the anti-etching layer 105 can weaken the energy of doping ions and prevent the lattice of the source-drain doped region 103 from being excessively damaged due to excessive implantation energy of doping ions, resulting in subsequent rapid diffusion of doping ions in lattice defects into the channel region in the fin 101, and when the semiconductor structure works, the source and drain depletion layers of the source-drain doped region 103 are easily expanded, resulting in serious short-channel effects. In addition, in the subsequent etching of the interlayer dielectric layer 104 to form an opening, the anti-etching layer 105 defines the etch stop position of the etching process, so as to reduce the probability of over-etching of the source-drain doped region 103 caused in the etching process.

The material of the anti-etching layer 105 is a material with a low-K dielectric constant. The material of the anti-etching layer 105 includes one or more of SiON, SiBCN, SiCN, carbon-doped SiN and oxygen-doped SiN. In some implementations, the material of the anti-etching layer 105 is carbon-doped SiN or oxygen-doped SiN.

Because the material of the anti-etching layer 105 is a material with a low-K dielectric constant, the material of the anti-etching layer 105 not only has the anti-etching effect, but also can reduce the capacitive coupling effect of the source-drain doped region 103 and the subsequent gate structure.

The anti-etching layer 105 should not be too thick or too thin. If the anti-etching layer 105 is too thick, it is not easy for ions to pass through the anti-etching layer 105 during the subsequent formation of the first doped region, resulting in that the doping concentration of the first doped region is too low and the region is too small, which is not beneficial to reducing the contact resistance between the contact hole plug and the source-drain doped region 103. If the anti-etching layer 105 is too thin, it is easy to damage the lattice of the source-drain doped region 103 in the subsequent formation of the first doped region, doping ions are easy to diffuse rapidly into the channel region in the fin 101 in the lattice defects, and when the semiconductor structure works, the source and drain depletion layers of the source-drain doped region 103 are easily expanded, resulting in serious short-channel effects. In some implementations, the thickness of the anti-etching layer 105 is 2 nanometers to 6 nanometers.

As illustrated in FIG. 5, the pseudo-gate structure 102 is removed, and a gate structure material layer (not shown) is formed at the pseudo-gate structure 102; the gate structure material layer is back-etched for part of the thickness to form a gate structure 106 and a groove on the gate structure 106; and a mask layer 107 is formed in the groove.

The gate structure 106 is used for controlling the connection and disconnection of the channel when the semiconductor structure works.

In some implementations, the gate structure 106 includes a gate dielectric layer 1061 covering part of the top surface and part of a sidewall of the fin 101 conformally and a metal gate layer 1062 over the gate dielectric layer 1061.

The material of the gate dielectric layer 1061 is a high-k dielectric layer. The material of high-k dielectric layer refers to the dielectric material with a relative dielectric constant greater than the relative dielectric constant of silicon oxide.

The metal gate layer 1062 is used as an electrode for realizing the electrical connection with an external circuit. In some implementations, the material of the metal gate layer 1062 is magnesium tungsten alloy.

The mask layer 107 is used for protecting the gate structure 106 in the subsequent manufacturing process. Specifically, the material of the mask layer 107 includes one or more of silicon nitride, silicon carbide, silicon carbonitride, silicon carboxynitride, silicon oxynitride, boron nitride and boron carbonitride. In some implementations, the material of the mask layer 107 includes silicon nitride.

Figure 6:
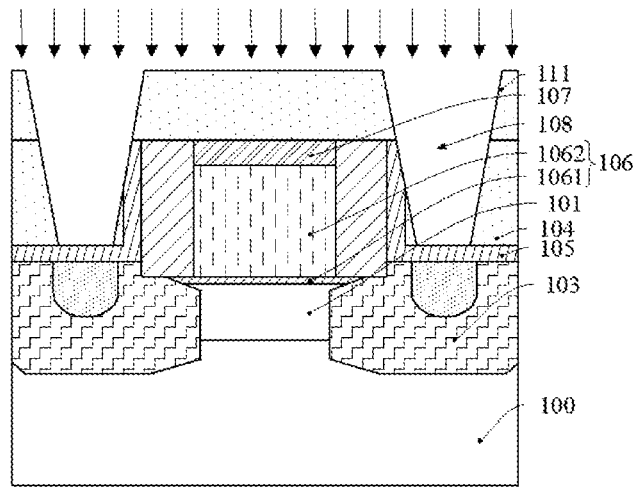

Referring to FIG. 6, the interlayer dielectric layer 104 is etched to form an opening 108 that exposes the source-drain doped region 103.

The opening 108 defines the doped region of the subsequent first doped region and the second doped region. In addition, the opening 108 is prepared for subsequent filling of the contact hole plug connected with the source-drain doped region 103.

In some implementations, the opening 108 exposing the source-drain doped region 103 refers to that the opening 108 exposes the anti-etching layer 105.

In the step of forming the opening 108 that exposes the source-drain doped region 103, the interlayer dielectric layer 104 is etched by taking the anti-etching layer 105 as an etch stop layer.

In some implementations, the interlayer dielectric layer 104 is etched by adopting a dry etching process to form the opening 108 that exposes the source-drain doped region 103. Dry etching process is an anisotropic etching process, which has better controllability of etching profile, reduces damage to other film structures, is beneficial to making the morphology of the opening 108 meet the technological requirements and improves the formation efficiency of the opening 108. In addition, dry etching process can take the anti-etching layer 105 as the etch stop layer in the etching process, such that the etching stop position can be easily controlled.

The method for forming the semiconductor structure further includes: after providing the base and before forming the opening 108, forming a dielectric layer 111 covering the gate structure 106 and the interlayer dielectric layer 104.

The dielectric layer 111 is used for realizing electrical isolation between adjacent devices, and the material of the dielectric layer 111 is an insulating material. In some implementations, the material of the dielectric layer 111 is silicon oxide.

It should be noted that, in the process of etching the interlayer dielectric layer 104 to form the opening 108, the polymer impurities produced by etching accumulate at the bottom of the opening 108, which makes the interlayer dielectric layer 104 at the bottom not easy to be etched, and in the extension direction perpendicular to the gate structure 106, the size of the top of the opening 108 is larger than the size of the bottom of the opening 108, that is, the opening 108 is in the shape of an inverted trapezoid.

Figure 7:
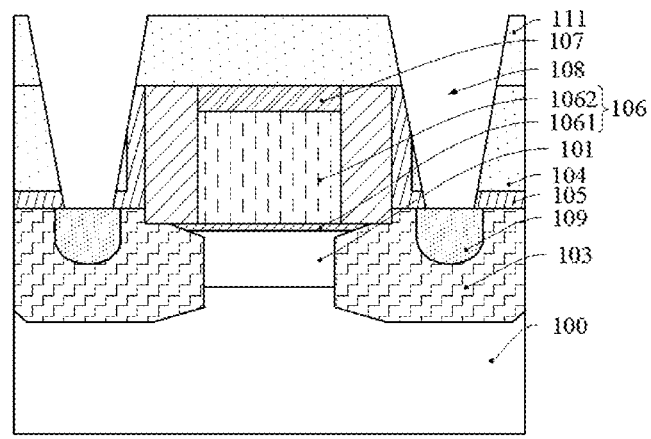
Figure 8:
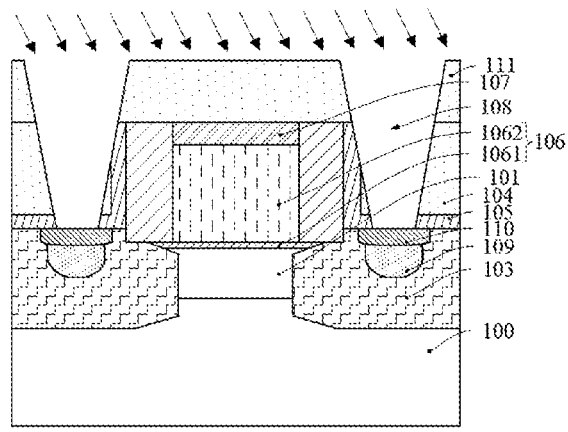

Referring to FIG. 7 and FIG. 8, a first doped region 109 and a second doped region 110 over the first doped region 109 are formed in the source-drain doped region 103 exposed by the opening 108 (as shown in FIG. 8), the projection of the second doped region 110 on the base covers the projection of the first doped region 109 on the base, the doping ion types of the first doped region 109, the second doped region 110 and the source-drain doped region 103 are the same, and the ion doping concentration of the first doped region 109 and the second doped region 110 is higher than the ion doping concentration of the source-drain doped region 103.

In some implementations, the second doped region 110 is located over the first doped region 109, the projection of the second doped region 110 on the base covers the projection of the first doped region 109 on the base, the doping ion types of the first doped region 109 and the second doped region 110 are the same as the doping ion type of the source-drain doped region 103, and the doping concentration of the first doped region 110 and the second doped region is higher than the doping concentration of the source-drain doping 103. The first doped region 109 and the second doped region 110 at the bottom of the opening 108 are etched subsequently to form a groove surrounded by the first doped region 109 and the second doped region 110; and a contact hole plug is formed in the opening 108 and the groove. The first doped region 109 is in contact with the bottom and a sidewall of the contact hole plug, the second doped region 110 is in contact with the sidewall of the contact hole plug, and the first doped region 109 and the second doped region 110 surround the contact hole plug in the source-drain doped region 103, such that the contact hole plug is not easily in direct contact with the source-drain doped region 103, the contact resistance between the contact hole plug and the source-drain doped region 103 is reduced, and the electrical performance of the semiconductor structure is improved.

In some implementations, the first doped region 109 is formed first and then the second doped region 110 is formed. In other implementations, the second doped region may be formed first and then the first doped region is formed.

Specifically, the step of forming the first doped region 109 and the second doped region 110 includes the following step:

As illustrated in FIG. 7, a first doped region 109 is formed at the top of the source-drain doped region 103 exposed by the opening 108, the doping ion type of the first doped region 109 is the same as the doping ion type of the source-drain doped region 103, and the ion doping concentration of the first doped region 109 is higher than the ion doping concentration of the source-drain doped region 103.

Compared with the source-drain doped region in which the first doped region is not formed, the first doped region 109 reduces the contact resistance between the subsequently formed contact hole plug and the source-drain doped region 103.

In some implementations, the step of forming the first doped region 109 includes performing ion doping on the anti-etching layer 105, and the ions pass through the anti-etching layer 105 to form the first doped region 109 in the source-drain doped region 103.

It should be noted that the first doped region 109 should not be too thick or too thin. If the first doped region 109 is too thick, that is to say, the area of the first doped region 109 is larger, because the ion doping concentration of the first doped region 109 is higher than the ion doping concentration of the source-drain doped region 103, the doping ions in the first doped region 109 can easily diffuse into the channel region in the fin 101, and when the semiconductor structure works, the source and drain depletion layers of the source-drain doped region 103 are expanded, resulting in serious short-channel effects. If the first doped region 109 is too thin, the bottom of the subsequently formed contact hole plug is easily located below the first doped region 109, and the bottom of the contact hole plug 113 is easily in direct contact with the source-drain doped region 103, resulting in large contact resistance between the bottom of the contact hole plug and the source-drain doped region 103. In some implementations, the thickness of the first doped region 109 is 3 nanometers to 20 nanometers.

In some implementations, the first doped region 109 is formed by adopting ion implantation.

In some implementations, the semiconductor structure is a PMOS, and the process parameters for forming the first doped region 109 include doping ions which includes one or more of boron, gallium and indium.

The ion implantation energy should not be too large or too small. If the ion implantation energy is too large, in the process of forming the first doped region 109, it is easy to cause excessive lattice damage to the source-drain doped region 103, and it is difficult to repair through the subsequent annealing process. Moreover, because too large implantation energy easily causes that the formed first doped region 109 is located in the central area or bottom area of the source-drain doped region 103, the subsequently formed contact hole plug is located at the top area of the source-drain doped region 103, and the contact hole plug is not easily in contact with the first doped region 109, such that it is not easy to reduce the contact resistance between the contact hole plug and the source-drain doped region 103. If the ion implantation energy is too small, it easily causes that the formed first doped region 109 is formed on the surface of the source-drain doped region 103, and the sidewall and bottom of the contact hole plug is in direct contact with the source-drain doped region 103, such that the contact resistance between the contact hole plug and the source-drain doped region 103 is too high. In some implementations, the implantation energy is 1 Kev to 5 Kev.

The ion implantation dose should not be too large or too small. If the ion implantation dose is too large, it is easy to cause that the ion doping concentration of the formed first doped region 109 is too high, and the doping ions are easily diffused into the channel region in the fin 101, and when the semiconductor structure works, the source and drain depletion layers of the source and drain doped region 103 are expanded, resulting in serious short-channel effects. If the ion implantation dose is too small, the doping concentration of the formed first doped region 109 is too low to reduce the contact resistance between the contact hole plug and the source-drain doped region 103. In this example, the implantation dose of the doping ions is 1E15 atoms per square centimeter to 3E15 atoms per square centimeter.

In some implementations, the included angle between the ion implantation direction and the normal of the base is 0 degree. In the process of performing ion doping on the source-drain doped region 103 exposed by the opening 108, it is easy to make the first doped region 109 be located right below the opening 108, the source-drain doped region 103 is etched subsequently to form the groove, the contact hole plug is formed in the groove, and the bottom area of the contact hole plug is easily wrapped the first doped region 109, such that the contact resistance between the contact hole plug and the source-drain doped region 103 can be reduced. Moreover, the included angle between the ion implantation direction and the normal of the base is 0 degree, which makes more doping ions be implanted into the source-drain doped region 103 and is beneficial to improving the doping concentration of the first doped region 109.

In other implementations, the semiconductor structure is an NMOS, and the process parameters for forming the first doped region include doping ions which includes one or more of phosphorus, arsenic and antimony; implantation energy which is 1 Kev to 5 Kev; implantation dose of doping ions which is 1E15 atoms per square centimeter to 3E15 atoms per square centimeter; and implantation direction, wherein the included angle between the implantation direction and the normal of the base is 0 degree.

It should be noted that, after forming the first doped region 109, annealing treatment is performed on the first doped region 109, and the annealing treatment is either peak annealing process or laser annealing process. Peak annealing process and laser annealing process are commonly used annealing processes in the field of semiconductors, and are beneficial to improving process compatibility.

Annealing treatment can activate the doping ions in the first doped region 109 and repair the lattice defects. Because the time of annealing treatment is short, the ions in the first doped region 109 are not easy to diffuse into the channel area below the gate structure 106, which makes the intensity of the electric field under the gate structure 106 not too strong and the gate structure 10 not easily destroyed when the semiconductor works subsequently.

As illustrated in FIG. 8, after forming the first doped region 109, ion doping is performed on the source-drain doped region 103 exposed by the opening 108, and a second doped region 110 is formed over the first doped region 109. The doping ion type of the second doped region 110 is the same as the doping ion type of the source-drain doped region 103, the ion doping concentration of the second doped region 110 is higher than the ion doping concentration of the source-drain doped region 103, and the projection of the second doped region 110 on the base covers the projection of the first doped region 109 on the base.

The opening 108 is in the shape of an inverted trapezoid. In the process of subsequently etching the first doped region 109 and the second doped region 110 to form the groove, the etching trajectory is easily downward along the sidewall of the opening 108, so the formed groove is also in the shape of an inverted trapezoid. The second doped region 110 is located over the first doped region 109, and the projection of the second doped region 110 on the base covers the projection of the first doped region 109 on the base, such that the top of the subsequently formed groove is located in the second doped region 110, and the contact hole plug subsequently formed in the groove is located in the first doped region 109 and the second doped region 109. Therefore, the sidewall of the subsequent contact hole plug is not easily in direct contact with the source-drain doped region 103, thus reducing the contact resistance between the contact hole plug and the source-drain doped region 103.

The second doped region 110 should not be too thick or too thin. If the second doped region 110 is too thick, that is to say, the area of the second doped region 110 is large, because the ion doping concentration in the second doped region 110 is higher than the ion doping concentration of the source-drain doped region 103, the doping ions in the second doped region 110 can easily diffuse into the channel region in the fin 101, and when the semiconductor structure works, the source and drain depletion layers of the source-drain doped region 103 are expanded, resulting in serious short-channel effects. If the second doped region 110 is too thin, the top sidewall of the contact hole plug formed in the groove 112 is easily in direct contact with the source-drain doped region 103, resulting in that the contact resistance between the contact hole plug and the source-drain doped region 103 is large. In some implementations, the thickness of the second doped region 110 is 2 nanometers to 5 nanometers.

In some implementations, the second doped region 110 is formed by adopting ion implantation.

In some implementations, the semiconductor structure is a PMOS, and the process parameters for forming the second doped region 110 include doping ions which include one or more of boron, gallium and indium.

The ion implantation energy should not be too large or too small. For specific description, refer to the formation of the first doped region 109, which will not be repetitively described here. In some implementations, the implantation energy is 1 Kev to 5 Key.

The ion implantation dose should not be too large or too small. For specific description, refer to the formation of the first doped region 109, which will not be repetitively described here. The implantation dose of doping ions is 1E15 atoms per square centimeter to 3E15 atoms per square centimeter.

The included angle between the ion implantation direction and the normal of the base should not be too large or too small. If the included angle is too large, according to the shielding effect of ion implantation, in the process of forming the second doped region 110, the ions doped into the source-drain doped region is easily caused to be fewer, resulting in poor formation quality of the second doped region 110. If the included angle is too small, in the extension direction perpendicular to the gate structure 106, the diffusion distance of the doping ions is small, resulting in that the width of the formed second doped region 110 is small, and the top of the subsequently formed contact hole plug is easily in direct contact with the source-drain doped region 103, resulting in that the contact resistance between the contact hole plug and the source-drain doped region 103 is large. In some implementations, the included angle between the implantation direction and the normal of the base is 4 degrees to 15 degrees.

In other implementations, the semiconductor structure is an NMOS, and the process parameters for the second ion doping include doping ions which include one or more of phosphorus, arsenic and antimony; implantation energy which is 1 Kev to 5 Kev; implantation dose of doping ions which is 1E15 atoms per square centimeter to 3E15 atoms per square centimeter; implantation direction, wherein the included angle between the implantation direction and the normal of the base is 4 degrees to 15 degrees.

The method for forming the semiconductor structure further includes, after forming the first doped region 109 and before performing second ion doping, removing the anti-etching layer 105 exposed by the opening 108.

In the process of removing the anti-etching layer 105 to make the doping ions to form the second doped region, the energy of the doping ions is not easily consumed in the process of implantation, such that the width of the second doped region 110 is larger in the extension direction perpendicular to the gate structure 106, the top of the subsequently formed contact hole plug is not easily in contact with the source-drain doped region 103 and it is beneficial to reducing the contact resistance between the contact hole plug and the source-drain doped region 103.

In some implementations, because the concentration of the source-drain doped region 103 is lower than the doping concentration of the first doped region 109 and the second doped region 110, the ion doping concentration gradually decreases in the direction from the opening 108 to the channel region, such that the doping ions in the first doped region 109 and the second doped region 110 are not easy to pass through the source-drain doped region 103 and enter the channel region, the probability of the expansion of the source and drain depletion layers of the source-drain doped region 103 when the semiconductor works is reduced, and the short-channel effects are improved.

It should be noted that, after forming the second doped region 110, annealing treatment is performed on the second doped region 110. For the description related to the annealing process, refer to the related description after the formation of the first doped region 109, which will not be repetitively described here.

Figure 9:
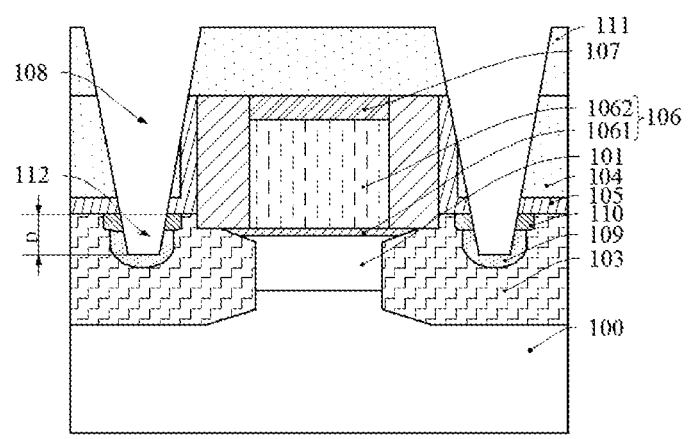

Referring to FIG. 9, after forming the second doped region 110, the first doped region 109 and the second doped region 110 at the bottom of the opening 108 are etched to form a groove 112 surrounded by the first doped region 109 and the second doped region 110.

The groove 112 provides a space for the subsequent formation of the contact hole plug, and the groove 112 is located in the source-drain doped region 103, which is beneficial to increasing the contact area between the contact hole plug and the source-drain doped region 103, thereby reducing the contact resistance between the contact hole plug and the source-drain doped region 103.

The groove 112 is surrounded by the first doped region 109 and the second doped region 110, and the doping concentration of the first doped region 109 and the second doped region 110 is higher than the doping concentration of the source-drain doped region 103, which is beneficial to reducing the contact resistance between the contact hole plug and the source-drain doped region 103.

In some implementations, a dry etching process is adopted to etch the first doped region 109 and the second doped region 110 to form the groove 112. Dry etching process is an anisotropic etching process, which has better controllability of etching profile, reduces the damage to other film structures, is beneficial to making the morphology of the groove 112 meet the technological requirements and improves the formation efficiency of the groove 112.

It should be noted that a distance D between a bottom surface of the groove 112 and a bottom surface of the opening 108 should not be too great. If the distance D is too great, that is, the groove 112 is too deep, the bottom surface of the groove 112 is located below the first doped region 109, and the bottom surface and part of the sidewall of the contact hole plug are n direct contact with the source-drain doped region 103, and the contact resistance is large, which is not beneficial to improving the electrical performance of the semiconductor structure. In some implementations, a distance between the bottom surface of the groove 112 and the bottom surface of the opening 108 is 2 nanometers to 15 nanometers.

Figure 10:
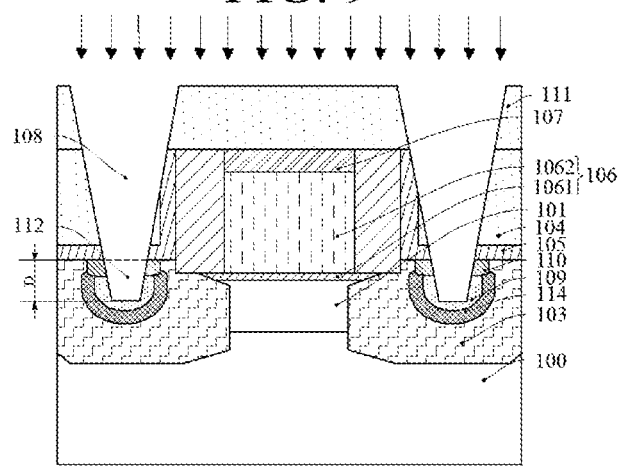
Figure 11:
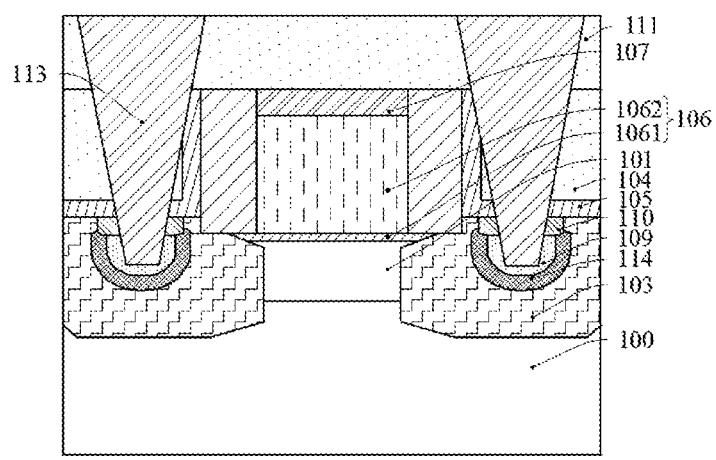

Referring to FIG. 10 and FIG. 11, a contact hole plug 113 is formed in the opening 108 and the groove 112 (as illustrated in FIG. 11).

The contact hole plug 113 is used for realizing the electrical connection in the semiconductor structure, and is also used for realizing the electrical connection between the semiconductor structure and the semiconductor structure.

The contact hole plug 113 is connected with the first doped region 109 and the second doped region 110, thereby reducing the contact resistance between the contact hole plug 113 and the source-drain doped region 103.

In some implementations, the material of the contact hole plug 113 is W. In other implementations, the material of the contact hole plug 113 may be Al, Cu, Ag, Au or the like.

The step of forming the contact hole plug 113 includes filling the opening 108 and the groove 112 with a conducting material, removing the conducting material higher than the opening 108, and using the conducting material in the opening 108 and the groove 112 as the contact hole plug 113.

It should be noted that, after forming the groove 112 and before forming the contact hole plug 113, a metal silicide layer (not shown) is formed on the sidewall and bottom surface of the groove 112.

The metal silicide layer is used for reducing the contact resistance between the contact hole plug 113 and the source-drain doped region 103.

Referring to FIG. 10, in some implementations, after forming the groove 112 and before forming the contact hole plug, the method further includes performing ion doping on the bottom of the groove 112 to form a third doped region 114, the doping ion type of the third doped region 114 is the same as the ion doping type of the source-drain doped region 103, and the ion doping concentration of the third doped region 114 is higher than the ion doping concentration of the source-drain doped region 103; the third doped region 114 is located between the first doped region 109 and the source-drain doped region 103, and is in contact with the first doped region 109; and the projection of the third doped region 114 on the base covers the projection of the second doped region 110 on the base.

The third doped region 114 further enlarges the high-concentration doped region, making it difficult for the bottom of the formed contact hole plug to be in direct contact with the source-drain doped region 103.

It should be noted that the third doped region 114 should not be too thick or too thin. If the third doped region 114 is too thick, that is to say, the area of the third doped region 114 is larger, because the ion doping concentration of the third doped region 114 is higher than the ion doping concentration of the source-drain doped region 103, the doping ions in the third doped region 114 can easily diffuse into the channel region in the fin 101, and when the semiconductor structure works, the source and drain depletion layers of the source-drain doped region 103 are expanded, resulting in serious short-channel effects. If the third doped region 114 is too thin, it is not easy to achieve the purpose of enlarging the high-concentration doped region, and the top sidewall of the contact hole plug in the groove is easily in direct contact with the source-drain doped region 103, resulting in large contact resistance between the contact hole plug and the source-drain doped region 103. In some implementations, the thickness of the third doped region 114 is 3 nanometers to 10 nanometers.

In some implementations, the third doped region 114 is formed by adopting ion implantation.

In some implementations, the semiconductor structure is a PMOS, and the process parameters for ion doping include doping ions which include one or more of boron, gallium and indium.

The ion implantation energy should not be too large or too small. If the ion implantation energy is too large, in the process of forming the third doped region 114, it is easy to cause excessive lattice damage to the source-drain doped region 103, and it is difficult to repair through the subsequent annealing process. Moreover, because too large implantation energy easily causes that the formed third doped region 114 is located in the central area or bottom area of the source-drain doped region 103, the ion doping concentration of the source-drain doped region 103 between the third doped region 114 and the first doped region 109 and between the third doped region 114 and the second doped region 110 is low, which makes the part of the area of the contact hole plug be easily in direct contact with the source-drain doped region 103, resulting in that the contact resistance between the contact hole plug and the source-drain doped region 103 is large. If the ion implantation energy is too small, it easily causes that the third doped region 114 is formed on the surface of the source-drain doped region 103, and it is difficult for the third doped region 114 to achieve the purpose of enlarging the high-concentration doped region. In some implementations, the implantation energy is 0.5 Kev to 2.5 Kev.

The ion implantation dose should not be too large or too small. If the ion implantation dose is too large, the ion doping concentration of the third doped region 114 will be too high, the doping ions will easily diffuse into the channel region in the fin 101, and when the semiconductor structure works, the source and drain depletion layers of the source-drain doped region 103 will be expanded, resulting in serious short-channel effects. If the ion implantation dose is too small, the doping concentration of the third doped region 114 is small. When the groove 112 (as illustrated in FIG. 10) is too deep, the contact hole plug is in contact with the third doped region 114. It is difficult for the third doped region 114 to achieve the purpose of reducing the contact resistance between the contact hole plug and the source-drain doped region 103. In this example, the ion implantation dose is 5E14 atoms per square centimeter to 15E14 atoms per square centimeter.

It should be noted that the included angle between the implantation direction and the normal of the base should not be too large or too small. If the included angle is too large, the doping ions in the third doped region 114 can easily diffuse into the channel region in the fin 101, and when the semiconductor structure works, the source and drain depletion layers of the source- and drain doped region 103 will be expanded, resulting in serious short-channel effects. If the included angle is too small, in the direction perpendicular to the sidewall of the gate structure 106, the diffusion distance of the doping ions is short, resulting in that the width of the formed third doped region 114 is small, the sidewall of the contact hole plug is easily in direct contact with the source-drain doped region 103, and it is not easy to reduce the contact resistance between the sidewall of the contact hole plug and the source-drain doped region 103. In some implementations, the included angle between the implantation direction and the normal of the base is 0 degree to 9 degrees.

In other implementations, the semiconductor structure is an NMOS, and the process parameters for ion doping include doping ions which include one or more of phosphorus, arsenic and antimony; implantation energy which is 0.5 Kev to 2.5 Kev; implantation dose of doping ions which is 5E14 atoms per square centimeter to 15E14 atoms per square centimeter; and implantation direction, wherein the included angle between the implantation direction and the normal of the base is 0 degree to 9 degrees.

In some implementations, because the concentration of the source-drain doped region 103 is lower than the doping concentration of the first doped region 109, the second doped region 110 and the third doped region 114, the ion doping concentration gradually decreases in the direction from the contact hole plug to the channel region in the substrate 100, such that the doping ions in the first doped region 109, the second doped region 110 and the third doped region 114 are not easy to pass through the source-drain doped region 103 and enter the channel region, the source and drain depletion layers of the source-drain doped region 103 are not easily expanded when the semiconductor works, and the short-channel effects are relieved.

It should be noted that, after forming the third doped region 114 and before forming the contact hole plug 113, the metal silicide layer is formed in the groove 112.

It should be noted that, after forming the third doped region 114, the method further includes performing annealing treatment on the third doped region 114. For the description related to the annealing process, refer to the description after the formation of the third doped region 114, which will not be repetitively described here.

In another form, the present disclosure further provides a semiconductor structure. FIG. 11 illustrates a structural schematic diagram of one form of a semiconductor structure according to the present disclosure.

The semiconductor structure includes: a base, the base including a substrate 100, a gate structure 106 over the substrate 100, a source-drain doped region 103 in the substrate 100 on two sides of the gate structure 106, and an interlayer dielectric layer 104 over the source-drain doped region 103; a contact hole plug 113 in the source-drain doped region 103, the source-drain doped region 103 covering part of the sidewall of the contact hole plug 113; a first doped region 109 in the source-drain doped region 103 and between the bottom of the contact hole plug 113 and the source-drain doped region 103, the doping ion type of the first doped region 109 being the same as the doping ion type of the source-drain doped region 103, and the ion doping concentration of the first doped region 109 being higher than the ion doping concentration of the source-drain doped region 103; and a second doped region 110 in the source-drain doped region 103 and over the first doped region 109, the doping ion type of the second doped region 110 being the same as the doping ion type of the source-drain doped region 103, the ion doping concentration of the second doped region 110 being higher than the ion doping concentration of the source-drain doped region 103, the second doped region 110 covering part of the sidewall of the source-drain doped region 113, and the projection of the second doped region 110 on the base covering the projection of the first doped region 109 on the base.

In some implementations, the first doped region 109 is in contact with the bottom and sidewall of the contact hole plug 113, the second doped region 110 is in contact with the sidewall of the contact hole plug, and the first doped region 109 and the second doped region 110 surround the contact hole plug 113 in the source-drain doped region 103, such that the contact hole plug 113 is not easily in direct contact with the source-drain doped region 103, the contact resistance between the contact hole plug 113 and the source-drain doped region 103 is reduced, and the electrical performance of the semiconductor structure is improved.

In addition, because the concentration of the source-drain doped region 103 is lower than the doping concentration of the first doped region 109 and the second doped region 110, the ion doping concentration gradually decreases in the direction from the contact hole plug 113 to the channel region in the substrate 100, such that the doping ions in the first doped region 109 and the second doped region 110 are not easy to pass through the source-drain doped region 103 and enter the channel region, the source and drain depletion layers of the source-drain doped region 103 are not easily expanded when the semiconductor works, and the short-channel effects are relieved.

In some implementations, the semiconductor structure is a fin field effect transistor (FinFET), and the substrate 100 is a substrate 100 with a fin 101. In other implementations, the formed semiconductor structure may also be a planar structure, and correspondingly, there is no fin on the substrate. In some implementations, the substrate 100 is a silicon substrate.

The fin 101 is used for providing the channel of the fin field effect transistor when the semiconductor structure works. In some implementations, the fin 101 and the substrate 100 are in an integral structure. The material of the fin 101 is the same as the material of the substrate 100.

The gate structure 106 spans the fin 101 and covers part of the top wall and part of the sidewall of the fin 101.

The gate structure 106 is used for controlling the connection and disconnection of the channel when the semiconductor structure works.

In some implementations, the gate structure 106 includes a gate dielectric layer 1061 covering part of the top surface and sidewall of the fin 101 conformally and a metal gate layer 1062 over the gate dielectric layer 1061.

The material of the gate dielectric layer 1061 is a high-k dielectric layer. In some implementations, the material of the gate dielectric layer 1061 is $HfO_2$.

The metal gate layer 1062 is used as an electrode for realizing the electrical connection with an external circuit. In some implementations, the material of the metal gate layer 1062 is magnesium tungsten alloy.

The source-drain doped region 103 is located in the fin 101 on two sides of the gate structure 106. When the semiconductor structure works, the source-drain doped region 103 provides stress for the channel below the gate structure 106 and improves the carrier mobility.

In some implementations, the semiconductor structure is used to form a PMOS transistor, that is, the material of the source-drain doped region 103 is silicon germanide doped with P-type ions. In some implementations, by doping P-type ions in silicon germanide, P-type ions replace the positions of silicon atoms in the lattice, the more P-type ions are doped, the higher the concentration of free electrons is, and the stronger the conductivity is. Specifically, P-type ions include B, Ga or In.

In other implementations, the semiconductor structure is used for forming an NMOS transistor, that is, the material of the source-drain doped region is correspondingly silicon carbide or silicon phosphide doped with N-type ions. By doping N-type ions in silicon carbide or silicon phosphide, N-type ions replace the positions of the silicon atoms in the lattice, the more N-type ions are doped, the higher the concentration of free electrons is, and the stronger the conductivity is. Specifically, N-type ions include P, As or Sb.

The interlayer dielectric layer 104 is used for realizing electrical isolation between adjacent semiconductor structures. Therefore, the material of the interlayer dielectric layer 104 is an insulating material. Specifically, the material of the interlayer dielectric layer 104 is silicon oxide.

The semiconductor structure further includes an anti-etching layer 105, which is located between the interlayer dielectric layer 104 and the source-drain doped region 103, and between the interlayer dielectric layer 104 and the gate structure 106.

In the process of forming the semiconductor structure, the anti-etching layer 105 originally covers the source-drain doped region 103, ion doping is performed on the anti-etching layer 105, and the doping ions pass through the anti-etching layer 105 to form the first doped region 109 in the source-drain doped region 103. In the process of forming the first doped region 109, the anti-etching layer 105 can weaken the energy of doping ions and avoid the excessive damage to the lattice of the source-drain doped region 103 caused by the excessive implantation energy of doping ions, which makes the doping ions not easy to diffuse rapidly into the channel region in the fin 101 in the lattice defects, when the semiconductor structure works, the source and drain depletion layers of the source-drain doped region 103 are not easily expanded and the short-channel effects are relieved. In addition, in the process of etching the interlayer dielectric layer 104 to form an opening 108 (as illustrated in FIG. 8), the anti-etching layer 105 defines the etch stop position of the etching process, such that the formation of the opening 108 by etching is guaranteed and the probability of over-etching of the source-drain doped region 103 caused by the etching process is reduced at the same time.

The material of the anti-etching layer 105 is a material with a low-K dielectric constant. The material of the anti-etching layer 105 includes one or more of SiON, SiBCN, SiCN, carbon-doped SiN and oxygen-doped SiN. In some implementations, the material of the anti-etching layer 105 is carbon-doped SiN or oxygen-doped SiN.

Because the material of the anti-etching layer 105 is a material with a low-K dielectric constant, the material of the anti-etching layer 105 can also play a role of reducing the capacitive coupling effect of the source-drain doped region 103 and the subsequent gate structure 106.

It should be noted that the anti-etching layer 105 should not be too thick or too thin. If the anti-etching layer 105 is too thick, it is not easy for ions to pass through the anti-etching layer 105 in the process of forming the first doped region 109, resulting in that the doping concentration of the first doped region 109 is too low and the region is too small, which is not beneficial to reducing the contact resistance between the contact hole plug and the source-drain doped region 103. If the anti-etching layer 105 is too thin, it is easy to damage the lattice of the source-drain doped region 103 in the process of forming the first doped region 109, doping ions are easy to diffuse rapidly into the channel region in the fin 101 in the lattice defects, and when the semiconductor structure works, the source and drain depletion layers of the source-drain doped region 103 are easily expanded, resulting in serious short-channel effects. In some implementations, the thickness of the anti-etching layer 105 is 2 nanometers to 6 nanometers.

The semiconductor structure further includes a mask layer 107 over the gate structure 106. The mask layer 107 is used for protecting the gate structure 106. Specifically, the material of the mask layer 107 includes at least one of silicon nitride, silicon carbide, silicon carbonitride, silicon carboxynitride, silicon oxynitride, boron nitride or boron carbonitride. In some implementations, the material of the mask layer 107 includes silicon nitride.

The contact hole plug 113 is located in the source-drain doped region 103, and the source-drain doped region 103 covers part of the sidewall of the contact hole plug 113. The contact hole plug 113 is used for realizing the electrical connection of devices in the semiconductor structure, and is also used for realizing the electrical connection between the semiconductor structure and another identical semiconductor structure.

In some implementations, the material of the contact hole plug 113 is W. In other implementations, the material of the contact hole plug may be Al, Cu, Ag, Au or the like.

The contact hole plug 113 is formed in the opening 108 (as illustrated in FIG. 9) and the groove 112 (as illustrated in FIG. 9). The opening 108 and the groove 112 are formed by etching the interlayer dielectric layer 104 and the source-drain doped region 103. In the process of etching the interlayer dielectric layer 104 and the source-drain doped region 103, polymer impurities produced by etching accumulate at the bottom of the opening 108 or the groove 112, resulting in that the interlayer dielectric layer 104 or the source-drain doped region 103 at the bottom is not easily etched, further, in the extension direction perpendicular to the gate structure 106, the size of the top of each of the opening 108 and the groove 112 is larger than the size of the bottom of each of the opening 108 and the groove 112, the opening 108 and the groove 112 are in the shape of an inverted trapezoid, and correspondingly, the contact hole plug 113 is in the shape of an inverted trapezoid.

The semiconductor structure further includes a dielectric layer 111 over the gate structure 106 and the interlayer dielectric layer 104, where the dielectric layer 111 covers part of the sidewall of the contact hole plug 113.

The dielectric layer 111 is used for realizing electrical isolation between adjacent devices, where the material of the dielectric layer 111 is an insulating material. In some implementations, the material of the dielectric layer 111 is silicon oxide.

The doping ion type of the first doped region 109 is the same as the doping ion type of the source-drain doped region 103, and the ion doping concentration of the first doped region 109 is higher than the ion doping concentration of the source-drain doped region 103.

The first doped region 109 is used for reducing the contact resistance between the contact hole plug 113 and the source-drain doped region 103. In some implementations, the semiconductor structure is a PMOS, and the doping ions of the first doped region 109 include one or more of boron, gallium and indium.

The ion doping concentration of the first doped region 109 should not be too high or too low. If the ion doping concentration is too high, the ion doping concentration of the formed first doped region 109 is too high, and the doping ions are easy to diffuse into the channel region in the fin 101, and when the semiconductor structure works, the source and drain depletion layers of the source-drain doped region 103 are expanded, resulting in serious short-channel effects. If the ion doping concentration of the first doped region 109 is too low, the ion doping concentration of the first doped region 109 is too low to reduce the contact resistance between the contact hole plug 113 and the source-drain doped region 103. In some implementations, the doping concentration of the first doped region 109 is 1E20 atoms per cubic centimeter to 3E20 atoms per cubic centimeter.

In other implementations, the semiconductor structure is an NMOS, and the doping ions of the first doped region include one or more of phosphorus, arsenic and antimony; and the doping concentration is 1E20 atoms per cubic centimeter to 3E20 atoms per cubic centimeter.

The first doped region 109 should not be too thick or too thin. If the first doped region 109 is too thick, that is to say, the area of the first doped region 109 is larger, because the ion doping concentration of the first doped region 109 is higher than the ion doping concentration of the source-drain doped region 103, the doping ions in the first doped region 109 can easily diffuse into the channel region in the fin 101, and when the semiconductor structure works, the source and drain depletion layers of the source-drain doped region 103 are expanded, resulting in serious short-channel effects. If the first doped region 109 is too thin, that is to say, the contact area between the contact hole plug 113 and the source-drain doped region 103 is smaller, it easily results in large contact resistance between the contact hole plug 113 and the source-drain doped region 103. In some implementations, the thickness of the first doped region 109 is 3 nanometers to 20 nanometers.

The doping ion type of the second doped region 110 is the same as the doping ion type of the source-drain doped region 103, the ion doping concentration of the second doped region 110 is higher than the ion doping concentration of the source-drain doped region 103, and the projection of the second doped region 110 on the base covers the projection of the first doped region 109 on the base.

In the extension direction perpendicular to the gate structure 106, the width of the second doped region 110 is larger, such that the top of the contact hole plug 113 is not easily in contact with the source-drain doped region 103, which is beneficial to reducing the contact resistance between the contact hole plug and the source-drain doped region 103.

In some implementations, the semiconductor structure is a PMOS, and the doping ions of the second doped region 110 include one or more of boron, gallium and indium.

It should be noted that the ion doping concentration of the second doped region 110 should not be too high or too low. For the specific description, refer to the description related to the first doped region 109, which will not be repetitively described here. In some implementations, the doping concentration of the second doped region 110 is 1E20 atoms per cubic centimeter to 3E20 atoms per cubic centimeter.

In other implementations, the semiconductor structure is an NMOS, and the doping ions of the second doped region include one or more of phosphorus, arsenic and antimony; and the doping concentration is 1E20 atoms per cubic centimeter to 3E20 atoms per cubic centimeter.

It should be noted that the second doped region 110 should not be too thick or too thin. If the second doped region 110 is too thick, that is to say, the area of the second doped region 110 is larger, and because the ion doping concentration of the second doped region 110 is higher than the ion doping concentration of the source-drain doped region 103, the doping ions in the second doped region 110 are easy to diffuse into the channel region in the fin 101, and when the semiconductor structure works, the source and drain depletion layers of the source-drain doped region 103 are expanded, resulting in serious short-channel effects. If the second doped region 110 is too thin, the top sidewall of the contact hole plug 113 in the groove 112 is easily in direct contact with the source-drain doped region 103, resulting in large contact resistance between the contact hole plug 113 and the source-drain doped region 103. In some implementations, the thickness of the second doped region 110 is 2 nanometers to 5 nanometers.

In some implementations, the semiconductor structure further includes a third doped region 114, wherein the third doped region 114 is located between the first doped region 109 and the source-drain doped region 103, and is in contact with the first doped region; and the doping ion type of the third doped region 114 is the same as the doping ion type of the source-drain doped region 103, the ion doping concentration of the third doped region 114 is higher than the ion doping concentration of the source-drain doped region 103, and the projection of the third doped region 114 on the base covers the projection of the second doped region 110 on the base.

The third doped region 114 further enlarges the high-concentration doped region, making it difficult for the bottom of the formed contact hole plug 113 to be in direct contact with the source-drain doped region 103. In some implementations, the semiconductor structure is a PMOS, and the doping ions of the third doped region 114 include one or more of boron, gallium and indium.

It should be noted that the doping concentration of the third doped region 114 should not be too high or too low. If the doping concentration is too high, the doping ions are easy to diffuse into the channel region in the fin 101, and when the semiconductor structure works, the source and drain depletion layers of the source-drain doped region 103 are expanded, resulting in serious short-channel effects. If the doping concentration is too low, the third doped region 114 cannot achieve the purpose of reducing the contact resistance between the contact hole plug 113 and the source-drain doped region 103. In this example, the doping concentration is 5E19 atoms per cubic centimeter to 15E19 atoms per cubic centimeter.

In other implementations, the semiconductor structure is an NMOS, and the doping ions of the third doped region include one or more of phosphorus, arsenic and antimony; and the doping concentration is 5E19 atoms per cubic centimeter to 15E19 atoms per cubic centimeter.

It should be noted that the third doped region 114 should not be too thick or too thin. If the third doped region 114 is too thick, that is to say, the area of the third doped region 114 is larger, because the ion doping concentration of the third doped region 114 is higher than the ion doping concentration of the source-drain doped region 103, the doping ions in the third doped region 114 can easily diffuse into the channel region in the fin 101, and when the semiconductor structure works, the source and drain depletion layers of the source-drain doped region 103 are expanded, resulting in serious short-channel effects. If the third doped region 114 is too thin, it is not easy to achieve the purpose of enlarging the high-concentration doped region. In some implementations, the thickness of the third doped region 114 is 3 nanometers to 10 nanometers.

It should be noted that the distance between a bottom surface of the contact hole plug 113 and the top surface of the source-drain doped region 103 should not be too great or too small. If the distance is too great, that is, the contact hole plug 113 is too deep in the source-drain doped region 103 and the contact hole plug 113 is located in the first doped region 109, the total thickness of the first doped region 109 and the third doped region 114 is too large, the doping ions in the first doped region 109 and the third doped region 114 are easy to diffuse into the channel region in the fin 101, and when the semiconductor structure works, the source and drain depletion layers of the source-drain doped region 103 are expanded, resulting in serious short-channel effects. In some implementations, the distance between the bottom surface of the contact hole plug 113 and the top surface of the source-drain doped region 103 is 2 nanometers to 15 nanometers.

In addition, because the concentration of the source-drain doped region 103 is lower than the doping concentration of the first doped region 109, the second doped region 110 and the third doped region 114, the ion doping concentration gradually decreases in the direction from the contact hole plug 113 to the channel region in the substrate 100, such that the doping ions in the first doped region 109, the second doped region 110 and the third doped region 114 are not easy to pass through the source-drain doped region 103 and enter the channel region, the source and drain depletion layers of the source-drain doped region 103 are not easily expanded when the semiconductor works, and the short-channel effects are relieved.

The semiconductor structure further includes a metal silicide layer (not shown), which is located between the first doped region 109 and the contact hole plug 113, and between the second doped region 110 and the contact hole plug 113.

The semiconductor structure may be formed by adopting the forming method described in the above embodiment or by adopting other forming methods. For the specific description of the semiconductor structure described in the embodiment, refer to the corresponding description in the above embodiment, which will not be repetitively here.

Although embodiments and implementations of the present disclosure are disclosed as above, the embodiments of the present disclosure are not limited thereto. One skilled in the art may make various changes and modifications without departing from the spirit and scope of the embodiments of the present disclosure. Therefore, the scope of protection of the embodiments of the present disclosure shall be subject to the scope defined by the claims.

What is claimed is:

1. A method for forming a semiconductor structure, comprising:
   providing a base, the base comprising:
      a substrate,
      a gate structure over the substrate,
      a source-drain doped region in the substrate on two sides of the gate structure, and
      an interlayer dielectric layer over the source-drain doped region;
   etching the interlayer dielectric layer to form an opening that exposes the source-drain doped region;
   forming a first doped region at a top of the source-drain doped region exposed by the opening and a second doped region over the first doped region, where:
      a projection of the second doped region on the base covers a projection of the first doped region on the base,
      the doping ion types of the first doped region, the second doped region and the source-drain doped region are the same, and
      the ion doping concentrations of the first doped region and the second doped region are higher than the ion doping concentration of the source-drain doped region;
   after forming the second doped region, etching the first doped region and the second doped region at a bottom of the opening to form a groove surrounded by the first doped region and the second doped region; and
   forming a contact hole plug in the opening and the groove.

2. The method for forming the semiconductor structure according to claim 1, wherein a thickness of the first doped region is 3 nanometers to 20 nanometers.

3. The method for forming the semiconductor structure according to claim 1, wherein the first doped region is formed by adopting ion implantation.

4. The method for forming the semiconductor structure according to claim 3, wherein:
   when the semiconductor structure is a PMOS, process parameters for forming the first doped region comprise:
      doping ions which comprise at least one of boron, gallium or indium;
      implantation energy which is 1 Kev to 5 Kev;
      implantation dose of doping ions which is 1E15 atoms per square centimeter to 3E15 atoms per square centimeter; and
      implantation direction, an included angle formed between the implantation direction and a normal of the base, is zero degree; or, when the semiconductor structure is an NMOS, the process parameters for forming the first doped region comprise:
  doping ions which comprise at least one of phosphorus, arsenic or antimony;
  implantation energy which is 1 Kev to 5 Kev;
  implantation dose of doping ions which is 1E15 atoms per square centimeter to 3E15 atoms per square centimeter; and
  implantation direction, an included angle formed between the implantation direction and the normal of the base, is zero degree.

5. The method for forming the semiconductor structure according to claim 1, wherein a thickness of the second doped region is 2 nanometers to 5 nanometers.

6. The method for forming the semiconductor structure according to claim 1, wherein the second doped region is formed by adopting ion implantation.

7. The method for forming the semiconductor structure according to claim 6, wherein:
when the semiconductor structure is a PMOS, process parameters for forming the second doped region comprise:
  doping ions which comprise at least one of boron, gallium or indium;
  implantation energy which is 1 Kev to 5 Kev;
  implantation dose of doping ions which is 1E15 atoms per square centimeter to 3E15 atoms per square centimeter; and
  implantation direction, an included angle formed between the implantation direction and the normal of the base, is 4 degrees to 15 degrees; or,
when the semiconductor structure is an NMOS, the process parameters for forming the second doped region comprise:
  doping ions which comprise at least one of phosphorus, arsenic or antimony;
  implantation energy which is 1 Kev to 5 Kev;
  implantation dose of doping ions which is 1E15 atoms per square centimeter to 3E15 atoms per square centimeter; and
  implantation direction, an included angle formed between the implantation direction and the normal of the base being 4 degrees to 15 degrees.

8. The method for forming the semiconductor structure according to claim 1, wherein:
the base further comprises an anti-etching layer between the interlayer dielectric layer and the source-drain doped region, and between the interlayer dielectric layer and the gate structure;
in the step of forming the opening that exposes the source-drain doped region, the interlayer dielectric layer is etched by taking the anti-etching layer as an etch stop layer;
the step of forming the first doped region comprises performing ion doping on the anti-etching layer, the ions passing through the anti-etching layer to form the first doped region in the source-drain doped region; and
the method for forming the semiconductor structure further comprises removing the anti-etching layer exposed by the opening after forming the first doped region and before forming the second doped region.

9. The method for forming the semiconductor structure according to claim 8, wherein a thickness of the anti-etching layer is 2 nanometers to 6 nanometers.

10. The method for forming the semiconductor structure according to claim 8, wherein the material of the anti-etching layer comprises at least one of SiON, SiBCN, SiCN, carbon-doped SiN or oxygen-doped SiN.

11. The method for forming the semiconductor structure according to claim 1, wherein:
the method further comprises: after forming the groove and before forming the contact hole plug, performing ion doping on the bottom of the groove to form a third doped region, where the doping ion type of the third doped region is the same as the doping ion type of the source-drain doped region, and the ion doping concentration of the third doped region is higher than the ion doping concentration of the source-drain doped region;
the third doped region is located between the first doped region and the source-drain doped region, and is in contact with the first doped region; and
a projection of the third doped region on the base covers a projection of the second doped region on the base.

12. The method for forming the semiconductor structure according to claim 11, wherein a thickness of the third doped region is 3 nanometers to 10 nanometers.

13. The method for forming the semiconductor structure according to claim 11, wherein the third doped region is formed by adopting ion implantation.

14. The method for forming the semiconductor structure according to claim 1, wherein in the step of forming the groove, a distance between a bottom surface of the groove and a bottom surface of the opening is 2 nanometers to 15 nanometers.

* * * * *